United States Patent [19]

Kagawa

[11] Patent Number: 5,594,387
[45] Date of Patent: Jan. 14, 1997

[54] AMPLIFIER CIRCUIT HAVING NAGATIVE FEEDBACK LOOP FOR SELF-BIAS

[75] Inventor: Shigeru Kagawa, Tokyo, Japan

[73] Assignee: NEC Corporation, Tokyo, Japan

[21] Appl. No.: 495,094

[22] Filed: Jun. 27, 1995

[30] Foreign Application Priority Data

Jun. 29, 1994 [JP] Japan .................. 6-168603

[51] Int. Cl.⁶ .................................................. H03K 3/45
[52] U.S. Cl. ............................. 330/259; 330/260
[58] Field of Search ........................... 330/107, 109, 330/260, 294, 301, 259

[56] References Cited

FOREIGN PATENT DOCUMENTS

| 2821942 | 11/1978 | Germany | 330/260 |
| 0003451 | 1/1979 | Japan | 330/259 |
| 0246604 | 10/1990 | Japan | 330/259 |
| 3255711 | 11/1991 | Japan . | |

*Primary Examiner*—Steven Mottola

[57] ABSTRACT

An amplifier circuit equipped with a negative feedback loop includes a differential amplifier circuit composed of a plurality of differential amplifier stages, first and second negative feedback circuits each including a low-pass filter and being provided between an associated one of an in-phase output and an opposite-phase output and an associated one of first and second inputs of the differential amplifier circuit. This amplifier circuit further includes a suppression circuit to suppress an a.c. component of a signal to be fed back by adding signals relative to the in-phase and opposite phase outputs.

7 Claims, 3 Drawing Sheets

AMPLIFIER CIRCUIT HAVING NAGATIVE FEEDBACK LOOP FOR SELF-BIAS

BACKGROUND OF THE INVENTION

The present invention relates to an amplifier circuit and, more particularly, to an intermediate frequency amplifier circuit having a negative feedback circuit.

An example of a conventional intermediate frequency amplifier is shown in FIG. 1. An intermediate frequency signal is supplied from a signal source 50 through a coupling capacitor 1 to a differential amplifier circuit 11. This circuit 11 is composed of a plurality of differential amplifiers connected in a cascade manner. In this drawing, however, only an initial stage differential amplifier 2 and the last stage differential amplifier 3 are shown. Although each of the differential amplifiers 2–3 has inverting and non-inverting inputs and true and complementary outputs, they are connected such that the differential amplifier circuit 11 has first and second input nodes B and C and first and second output nodes D and E. Moreover, the signal at the first output node D is opposite in phase to the signal at the first input node B and further to the signal at the second output node C. The output node D is connected to an output terminal 10.

The input signal is subject to the d.c. blocking by the capacitor 1. That is, an a.c. component of the input signal is supplied to the first input node D of the differential amplifier circuit 11 and then amplified by each of the amplifiers 2–3 in the differential amplifier circuit 11. The true output signal at the output node D of the differential amplifier circuit 11 is supplied to the output terminal 10 and further fed back to the first input node B through a low-pass filter 13. The complementary output signal at the node E is also fedback to the second input node C through a low-pass filter 12. Thus, two negative feedback look are provided to construct a self-bias circuit.

The low-pass filter 13 is composed of a resistor 7 and a filter capacitor 9, and the output of the low-pass filter 13 is supplied to the input node B through a resistor 5. This resistor 5 determines an input impedance of the differential amplifier circuit 11. The low-pass filter 12 is composed of a resistor 6 and a filter capacitor 8. The low-pass filters 12 and 13 thus constituted function to cut off an a.c. component of the true and complementary output signals of the differential amplifier circuit 11 and to allow a d.c. component thereof to be fed back to thereby stabilize a d.c. operating point of the differential amplifier circuit 11, respectively.

In the intermediate frequency amplifier circuit thus constructed, a loop gain Gb of a loop from the node B through the differential amplifier circuit 11 and the node D to the node F which is an output of the low-pass filter 13 is given by the following equation (1):

$$Gb = G11(1+\omega^2 Cf^2 Rf^2)^{-(1/2)} \quad (1)$$

where G11 is a gain of the differential amplifier circuit 11, Rf is a resistance value of each of the feedback resistors 6 and 7, Cf is a capacitance of each of the filter capacitors 8 and 9 and ω is an angular frequency of the signal.

Generally, in a feedback circuit, representing an open loop gain by G (G11 in the above equation (1)), a feedback factor by β, G·β is a loop gain and, thus, in FIG. 1, the loop gain Gb in the equation (1) corresponds to a gain of the portion from the node B through the node D to the node F when the feedback path is cut immediately after, for example, the biasing resistor 5.

Further, since the feedback loop including the nodes C, E and G has the same construction as that of the feedback loop including the nodes B, D and F, a loop gain Gc of the portion from the node C through the differential amplifier circuit 11 and the node E to the node G which is the output of the low-pass filter 12 is equal to Gb. Therefore, the following equation (2) is established:

$$Gc = Gb \quad (2)$$

That is, the signals which are the same in magnitude and opposite in phase are fedback to the nodes B and C connected to the inputs of the differential amplifier circuit 11, respectively.

Therefore, a feedback gain Gr (loop gain of the differential signal) of the differential output between the nodes F and G with respect to the differential input between the nodes B and C can be represented from the equations (1) and (2) by the following equation (3):

$$\begin{aligned} Gr &= Gb - (-Gc) = Gb + Gc \\ &= 2Gb \\ &= 2G11 \, (1 + \omega^2 \, Cf^2 \, Rf^2)^{-1/2} \end{aligned} \quad (3)$$

In such conventional intermediate frequency amplifier circuit, the feedback gain is determined by the capacitance Cf and the resistance Rf of the capacitors and the resistors constituting the low-pass filters 12 and 13 as shown by the equation (3). However, when, in order to miniaturize circuit elements, the capacitance Cf and feedback resistance Rf are made smaller, the feedback gain Gf becomes large, leading to degradation of oscillation stability.

In order to stabilize the operation of such intermediate frequency amplifier circuit, Japanese Patent Application Laid-open No. Hei 3-255711 proposes an intermediate frequency amplifier circuit which comprises d.c. voltage feedback means for applying a predetermined feedback voltage to an output of a predetermined one of transistors included in a last stage differential amplifier thereof and feeding back it to a predetermined one of transistors included in an initial differential amplifier and biasing means for applying a biasing voltage which is substantially equal to the feedback voltage supplied by the d.c. voltage feedback means to another transistor of the initial state differential amplifier than the predetermined transistor thereof.

In the proposed intermediate frequency amplifier circuit mentioned above, the operation thereof is stabilized by performing the d.c. feedback such that the feedback voltage from the last stage differential amplifier which is related to the d.c. feedback becomes equal to the biasing voltage of the transistor of the initial stage differential amplifier.

In the proposed intermediate frequency amplifier circuit, however, a biasing circuit for making the feedback voltage from the last stage differential amplifier equal to the biasing voltage of the transistor of the initial stage differential amplifier is required. Therefore, the number of circuit elements is not reduced and rather the circuit size becomes larger.

Further, in the proposed amplifier circuit, in order to set the feedback gain, it is necessary to determine the bias by means of the d.c. feedback means and the feedback voltage and, thus, in order to reduce the circuit element size, the biasing circuit itself must be miniaturized. Further, in order to obtain a required biasing voltage, there is a limit in reducing the element size, necessarily.

SUMMARY OF THE INVENTION

It is therefore an object of the present invention is to provide an improved amplifier circuit equipped with a negative feedback loop.

Another object of the present invention is to provide a feedback type intermediate frequency amplifier circuit which can improve the oscillation stability and is suitable for reduction of the circuit element size and the circuit size.

An amplifier circuit according to the present invention comprises a differential amplifier circuit including a first input node, a second input node, a first output node and a second output node, a first feedback circuit including a first low-pass filter and provided between the first output node and the first input node of the differential amplifier circuit a second feedback circuit including a second low-pass filter and provided between the second output node and the second input node of the differential amplifier circuit, and a suppression circuit coupled to the first and second feedback circuits and suppressing an a.c. component of a signal fed back to the first input node by adding signals relative to the output signals at the first and second output nodes.

Specially, the present invention utilizes that the signal at the first output node is opposite in phase to the signal at the second output node. The adding resultant signal of those two signals includes substantially no a.c. component. As a result, the signal to be fed back to the first input node is also free from an a.c. component. Therefore, the gain margin thereof is larger than that of the conventional circuit by 6 dB and thus the oscillation stability is improved. According to the present invention, when the resistors and capacitors constituting the low-pass filters are miniaturized, the feedback gain becomes a half of that of the conventional circuit and the gain margin is improved by 6 dB. Therefore, the miniaturization of the circuit elements can be realized.

It is to be noted that the addition of two signals can be performed on the output signals from the first and second low-pass filters.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
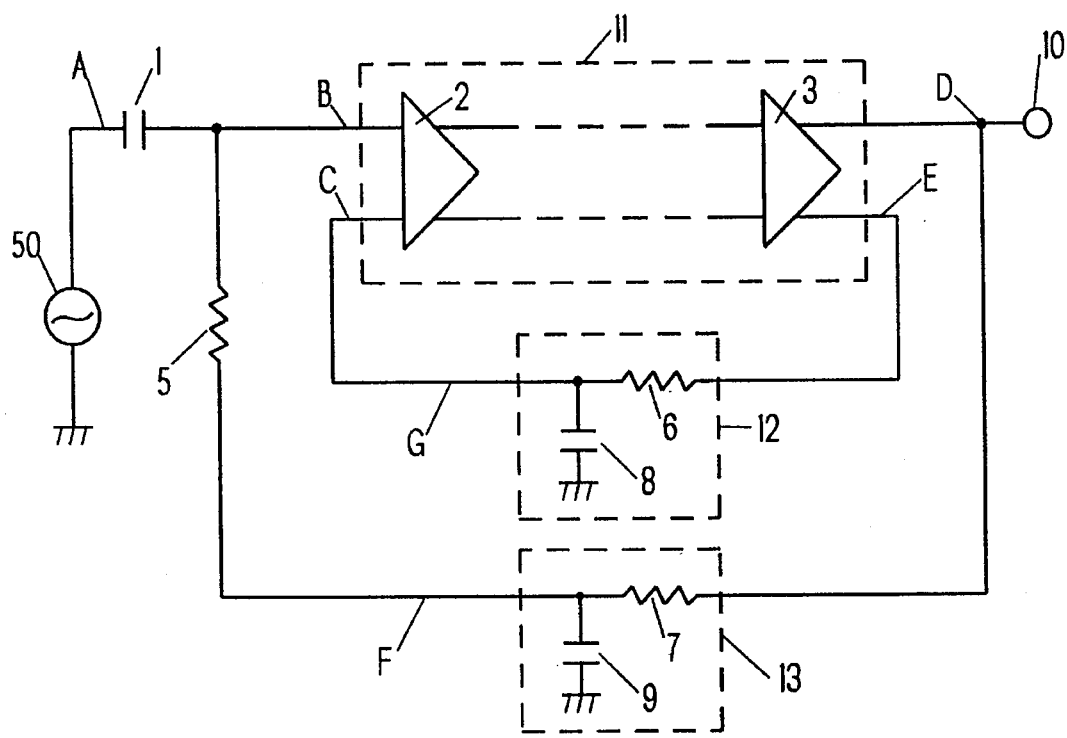
FIG. 1 is a circuit diagram illustrative of a prior art circuit.
Figure 2:
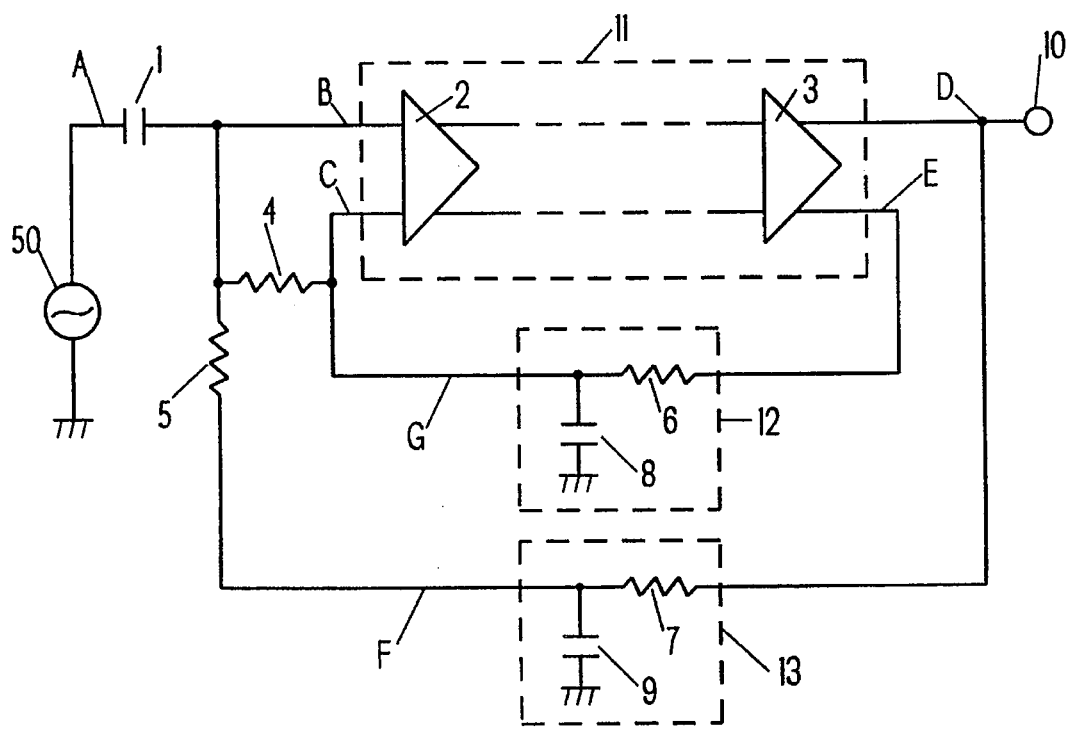
FIG. 2 is a circuit diagram illustrative of an amplifier circuit according to a first embodiment of the present invention.

Referring now to FIG. 2, there is shown an amplifier circuit according to a first embodiment of the present invention as an intermediate frequency amplifier circuit, in which the same constituents as those shown in FIG. 1 are depicted by the same reference numerals to omit the further description thereof.

In this circuit, a resistor 4 is provided between the input nodes B and C as a suppression circuit is accordance with the present invention. This resistor 4 has the same resistance value as the resistor 5. In this embodiment, since the parallel resistance value of the resistors 4 and 5 represents an input impedance of this circuit, the value of each of the resistors 4 and 5 is designed to be 2 KΩ or so.

In operation, since the low-pass filter 12 has the same construction and the same time constant as the low-pass filter 13, although signals appearing at respective nodes G and F have slight a.c. components, respectively, they are opposite in phase and the same in amplitude. These signals are their added with each other at a node H through the resistors 4 and 5. As a result, the signal at the node H is free from an a.c. component and has only a d.c. component. In other words, only the d.c. level is fed back to the signal input node B of the differential amplifier circuit 11.

Thus, in the signal path from the node B through the differential amplifier circuit 11, the node D to the node F, the loop gain Gb of the a.c. signal (having angular frequency ω) becomes zero as follow:

$$Gb=0 \qquad (4)$$

The loop gain Gc from the node C through the node E to the node G is given by the following equation (5) similarly to the conventional circuit shown in FIG. 1.

$$Gc = G11(1+\omega^2 C_f^2 R_f^2)^{-(1/2)} \qquad (5)$$

Therefore, the feedback gain Gf of the differential output at the nodes B and C with respect to the differential input is given from the equations (4) and (6) by the following equation (6):

$$\begin{aligned} Gf &= Gb - (-Gc) = Gc \\ &= G11(1+\omega^2 C_f^2 R_f^2)^{-(1/2)} \end{aligned} \qquad (6)$$

Comparing the equation (6) with the equation (3) of the conventional circuit shown in FIG. 1, it is apparent that the feedback gain Gf of this embodiment is smaller than that of the conventional circuit by 6 dB and the oscillation stability is improved. Therefore, in this embodiment, even when the resistors and capacitors constituting the low-pass filters are miniaturized, the feedback gain becomes a half of that of the conventional circuit and the gain margin is improved by 6 dB. The phase margin is also improved similarly.

Figure 3:
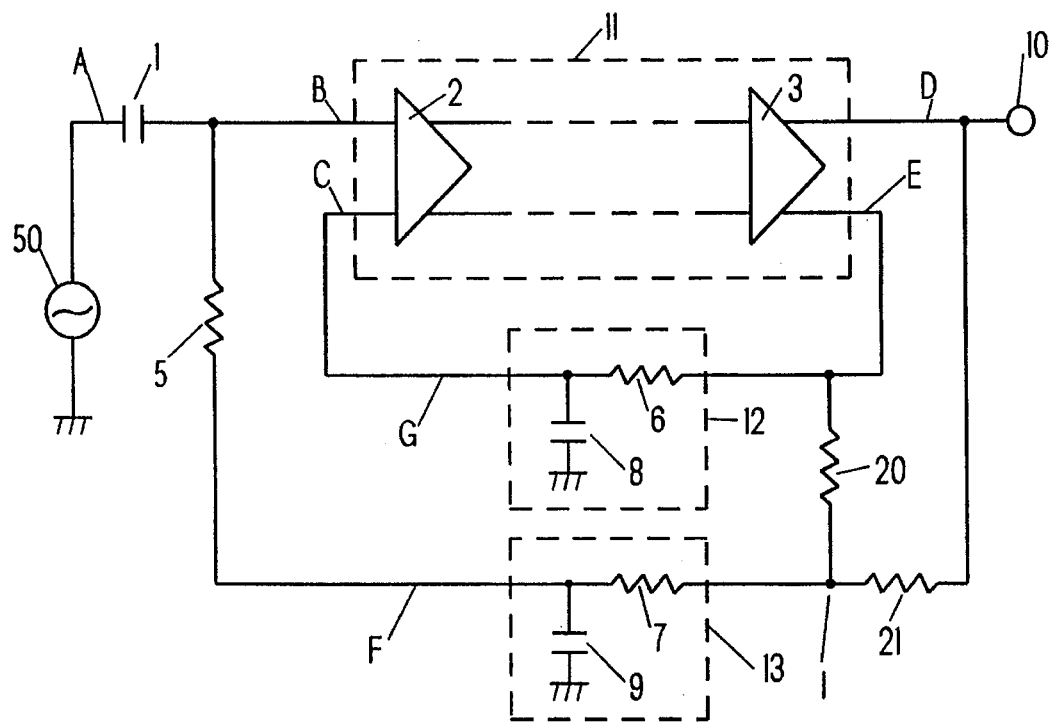
FIG. 3 is a circuit diagram illustrative of a second embodiment of the present invention.

Turning to FIG. 3, in the circuit shown therein, a resistor 21 is connecting between the first output node D (the output terminal 10) and the input I of the low-pass filter 13, and a resistor 20 is connected between the second output node E and the input I of the low-pass filter 13. These resistors 20 and 21 have the same resistance value as each other. Accordingly, the signal supplied to the low-pass filter 13 has substantially no a.c. component. Only a d.c. level is thus fed back to the first input node B. Thus, the circuit as shown in FIG. 3 provides the substantially same effect as that shown in FIG. 2. It is, however, to be noted that the circuit of FIG. 3 requires two resistors 20 and 21, whereas the circuit of FIG. 2 requires only one resistor 4. In other words, the circuit of FIG. 2 uses the resistors 4 and 5 as not only a suppression circuit but also an input impedance determination circuit. Accordingly, the circuit of FIG. 2 is more advantageous than that of FIG. 3.

Figure 4:
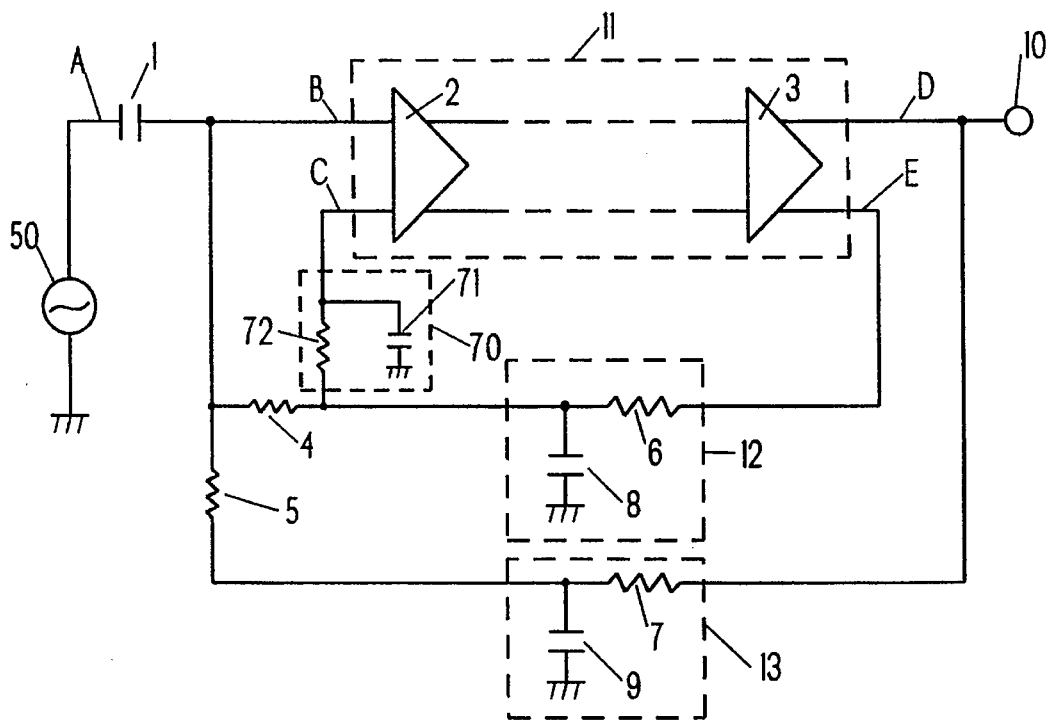
FIG. 4 is a circuit diagram illustrative of a third embodiment of the present invention.

Referring to FIG. 4, an amplifier circuit shown therein further includes a third low-pass filter 70 composed of a resistor 71 and a capacitor 72. This filter 70 is provided between the second input node C and the one end of the resistor 4 and thus further filters an a.c. component of the output from the low-pass filter 12. Therefore, the second input node C is also free from the a.c. component to thereby further enhance the gain margin thereof.

Figure 5:
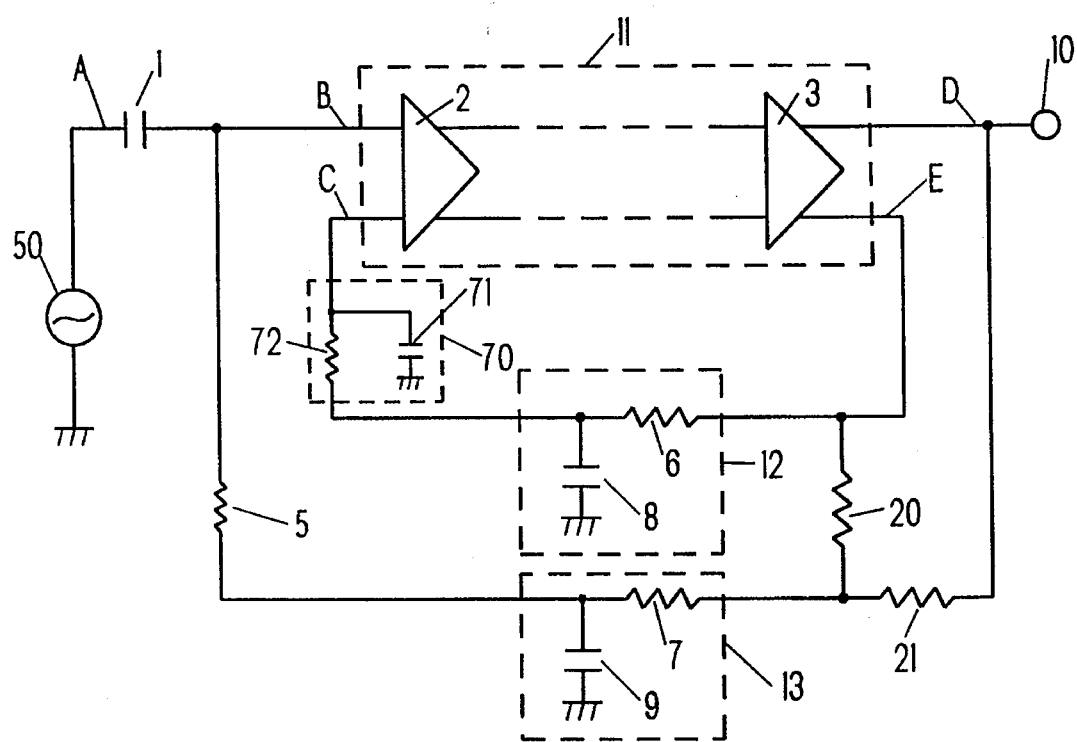
FIG. 5 is a circuit diagram illustrative of a fourth embodiment of the present invention.

In accordance with the technique as shown in FIG. 4, an additional low-pass filter may be provided between the nodes C and G of the circuit shown in FIG. 3, as shown in FIG. 5 as a fourth embodiment of the present invention.

As described hereinbefore, according to the present invention, the feedback gain of the differential signal is reduced and thus the oscillation stability is improved by feeding back the signal obtained by combining the in-phase output and the opposite phase output of the differential amplifier circuit to the signal input terminal thereof. Further, according to the present invention, the feedback gain of the differential signal becomes a half of the feedback gain of the conventional intermediate frequency amplifier circuit, that is, smaller by 6 dB, by connecting the feedback paths of the in-phase output and the opposite phase output of the differential amplifier circuit by the resistor so that the signal whose a.c. component is cancelled out is fed back to the signal input terminal. Due to the reduced feedback gain, the oscillation stability is considerably improved.

Therefore, according to the present invention, when the resistors and capacitors constituting the low-pass filters are miniaturized, the feedback gain becomes a half of that of the conventional circuit and the gain margin (phase margin) is improved by 6 dB. Therefore, the miniaturization of the circuit elements can be realized.

Further, since, according to the present invention, it is possible to improve the gain margin and phase margin, to improve the oscillation stability and to make miniaturization of circuit elements possible by simply inserting a resistor between the in-phase feedback path and the opposite phase feedback path, the practical effect of the present invention is considerable.

It is apparent that the present invention is not limited to the above embodiments but may be modified and changed without departing from the scope and spirit of the invention.

What is claimed is:

1. An amplifier circuit comprising a differential amplifier circuit having a first input node supplied with an input signal, a second input node, a first output node and a second output node, a first feedback loop including a first low-pass filter and provided between said first output node and said first input node, a second feedback loop including a second low-pass filter and provided between said second output node and said second input node, and first means coupled to said first and second feedback loops for suppressing an a.c. component of a signal to be fed back to said first input node by adding signals relative to signals at said first and second output nodes.

2. The circuit as claimed in claim 1, wherein said first means comprises a first resistor coupled between an output of said first low-pass filter and said first input node and a second resistor coupled between an output of said second low-pass filter and said first input node.

3. An amplifier circuit comprising a differential amplifier circuit having a first input node supplied with an input signal, a second input node, a first output node and a second output node, a first feedback loop including a first low-pass filter and provided between said first output node and said first input node, a second feedback loop including a second low-pass filter and provided between said second output node and said second input node, first means coupled to said first and second feedback loops for suppressing an a.c. component of a signal to be fed back to said first input node by adding signals relative to signals at said first and second output nodes, said first means comprising a first resistor coupled between an output of said first low-pass filter and said first input node and a second resistor coupled between an output of said second low-pass filter and said first input node, and second means coupled between the output of said second low-pass filter and said second input node for suppressing an a.c. component of a signal to be fed back to said second input node.

4. The circuit as claimed in claim 3, wherein said second means comprises a third low-pass filter.

5. An amplifier circuit comprising:

a differential amplifier circuit having a first input node supplied with an input signal, a second input node, a first output node and a second output node, a first feedback loop including a first low-pass filter and provided between said first output node and said first input node, a second feedback loop including a second low-pass filter and provided between said second output node and said second input node, first means coupled to said first and second feedback loops for suppressing an a.c. component of a signal to be fed back to said first input node by adding signals relative to signals at said first and second output nodes, said first means including a first resistor coupled between said first output node and an input of said first low-pass filter and a second resistor coupled between said second output node and the input of said first low-pass filter.

6. The circuit as claimed in claim 5, further comprising second means coupled between an output of said second low-pass filter and said second input node for suppressing an a.c. component of a signal to be fed back to said second input node.

7. The circuit as claimed in claim 6, wherein said second means comprises a third low-pass filter.

* * * * *